(12) United States Patent
Garcia et al.

(10) Patent No.: US 6,344,738 B1
(45) Date of Patent: Feb. 5, 2002

(54) NON-MAGNETIC SYSTEM FOR A MEMORY DISK TEST SYSTEM

(75) Inventors: Jose H. Garcia, Hollister; Tony Mello, San Jose; Eric C. O'Brien, Milpitas, all of CA (US); Joseph D. Perrault, Boca Raton, FL (US); Bob C. Robinson, Hollister; Hong S. Seing, San Jose, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/491,077

(22) Filed: Jan. 24, 2000

(51) Int. Cl.⁷ ................................................ G01R 33/12
(52) U.S. Cl. .................................... 324/212; 360/97.01
(58) Field of Search ............................. 324/212, 210; 360/97.01, 97.03, 99.04, 99.08, 99.09; 29/90.01

(56) References Cited

U.S. PATENT DOCUMENTS

| | | | | |
|---|---|---|---|---|
| 4,502,082 A | * | 2/1985 | Ragle et al. | 360/76 |
| 5,491,413 A | * | 2/1996 | Guzik | 324/212 |
| 5,606,472 A | * | 2/1997 | Akagi et al. | 360/97.01 |
| 5,801,531 A | * | 9/1998 | Viches et al. | 324/212 |
| 5,825,180 A | * | 10/1998 | Guzik | 324/212 |

FOREIGN PATENT DOCUMENTS

| | | | |
|---|---|---|---|
| DE | 19709267 A1 | * | 9/1998 |
| JP | 2-95181 | * | 4/1990 |

OTHER PUBLICATIONS

Koganezawa et al., "Dual–Stage Actuator System for Magnetic Disk Drives Using a Shear Mode Piezoelectric Microactuator", IEEE, vol. 35, No. 2, Mar. 1999.*

* cited by examiner

Primary Examiner—Jay Patidar
(74) Attorney, Agent, or Firm—Sawyer Law Group LLP; Richard A. Tomlin

(57) ABSTRACT

A system for use in a memory disk test system is disclosed. The system comprises a fixture for holding a disk head and a moveable slide coupled to the fixture. The system includes a non-magnetic motor system engageably coupled to the slide for moving the test fixture. A system and method in accordance with the present invention offers an SDT system which utilizes piezoelectric motors resulting in higher throughput in producing memory disks. The system and method further achieves high performance, is lower cost in implementation, and is more compact than conventional SDT systems. The system and method, by removing time delay, offers the advantage of cycle time reduction over conventional SDT systems.

12 Claims, 7 Drawing Sheets

NON-MAGNETIC SYSTEM FOR A MEMORY DISK TEST SYSTEM

FIELD OF THE INVENTION

The present invention relates generally to memory disk test systems and more particularly to a system for performing tests on disks utilizing non-magnetic motors.

BACKGROUND OF THE INVENTION

Currently, a test system for a disk utilized in a disk drive product utilizes magnetic motors such as a DC servo motor, either brush or brushless type, to perform all the motions of the head. A Single Disk Test (SDT) system is used to certify that all disks will perform to the product specification when they are installed in hard disk drive products. The Single Disk Test system performs at least the following processes and tests: (1) surface polishing, (2) surface imperfection testing and (3) data read/write testing utilizing a plurality of scanner systems. Each of these tests is described in detail hereinbelow.

Conventional SDT systems utilize electric motors for each of the scanner systems. Electric motors produce inductive fields when moving the fixture on top of the disk for the various processes and tests. Since the disk contains magnetic properties, the disk is sensitive to the inductive fields. In addition, motors utilized to move the process and test fixtures are typically large in order to move the fixtures appropriately and therefore add significantly to the size of the system. Finally such motors must remain on during the tests. It is desirable to reduce the size of the test system as hard drive products become smaller.

Accordingly, what is needed is a system and method for overcoming the above-identified problems. The present invention addresses such a need.

SUMMARY OF THE INVENTION

A system for use in a memory disk test system is disclosed. The system comprises a fixture for holding a disk head and a moveable slide coupled to the fixture. The system includes a non-magnetic motor system engageably coupled to the slide for moving the test fixture.

A system and method in accordance with the present invention offers an SDT system which utilizes piezoelectric motors resulting in higher throughput in producing memory disks. The system and method further achieves high performance, is lower cost in implementation, and is more compact than conventional SDT systems. The system and method, by removing time delay, offers the advantage of cycle time reduction over conventional SDT systems.

DETAILED DESCRIPTION

The present invention relates generally to memory disk test system and more particularly to a system for performing tests on disks utilizing non-magnetic motors. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
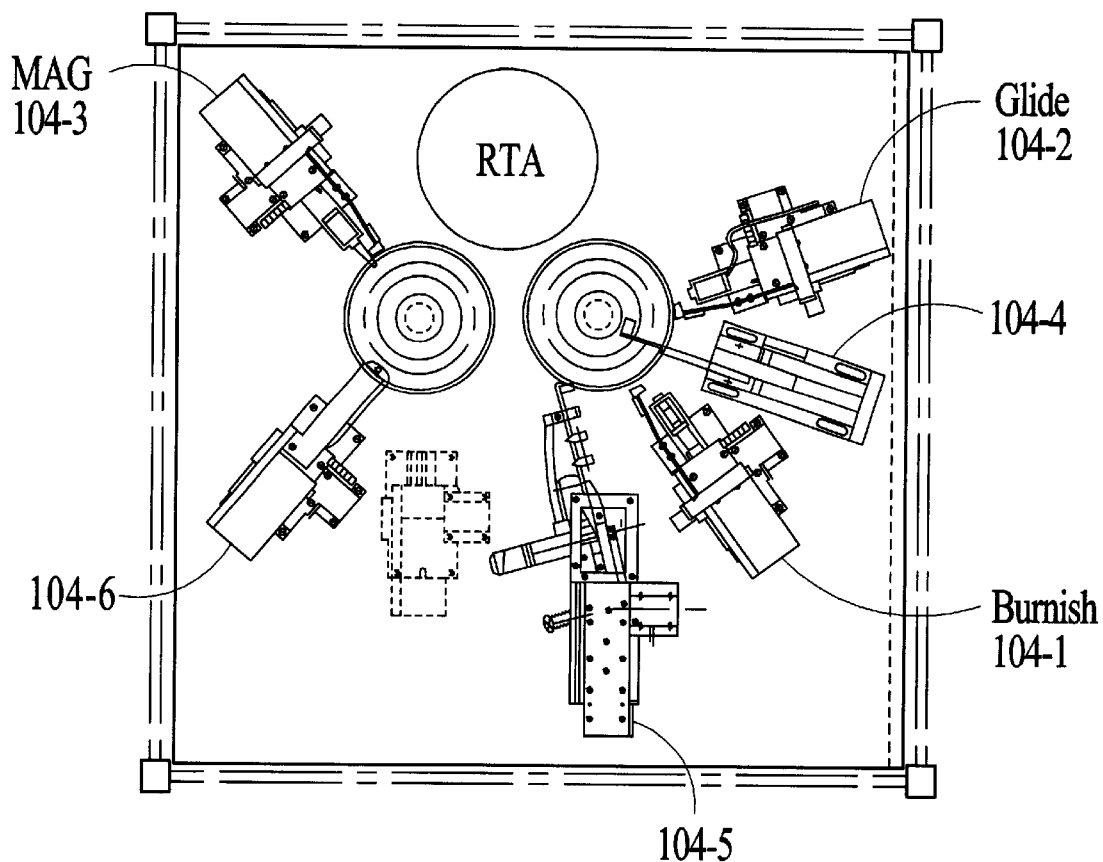
FIG. 1 illustrates a single disk test (SDT) system.

FIG. 1 illustrates a single disk test (SDT) system 100. The SDT system 100 comprises a plurality of scanner systems 104-1 to 104-6 and is used to certify that all disks will perform to the product specification when they are installed in hard disk drive products such as a disk drive manufactured by International Business Machines. The Single Disk Test system 100 performs at least the following processes and tests: (1) surface polishing (scanner system 104-1), (2) surface imperfection testing (scanner system 104-2) and (3) data read/write testing (scanner system 104-3). Other tests are performed on scanner systems 1044, 104-5, and 104-6. Tests 1, 2, and 3 are described in detail hereinbelow.

1. Surface Polishing (104-1)

Surface polishing removes debris left on the disk surface from previous process steps and polishes away other surface imperfections such as light scratches. This process step is very important since the read/write heads in a disk drive are very sensitive to surface imperfections.

2. Surface Imperfection Testing (104-2)

The surface test is used to check the surface of the disk for imperfections that can cause quality problems. Typically, this test can detect a surface imperfection that is in the range of 25–72 nanometers high.

3. Data Read/Write Test (104-3)

The data read/write test uses a head to read and write data on the disk surface. After the data is written on the disk surface the tests are performed on the signal that is read from the disk surface to determine if the disk meets the quality specifications for the product.

The SDT system 100 utilizes electric motors on each of the scanner systems 104-1 to 104-3 to move the fixture to perform the various processes and tests. The electric motors produce inductive fields when moving the fixture on top of the disk. Since the disk contains magnetic properties, the disk is sensitive to the inductive fields. In addition, the electric motors which are part of a closed loop system utilized in such a system to move the fixtures during the process are typically very large in order to move the fixtures appropriately and therefore add significantly to the size of the test system. It is desirable to reduce the size of the test system as hard drive products become smaller. In addition, it is important to minimize the space that these SDT systems occupy to reduce the clean room cost.

Normally, when the electric motor stops, the amplifier or the servo must stay on to maintain the position of the scanner. When the servo is on, the scanner has a slight motion (haunting) because the motor is seeking to maintain the position. This is not desirable. One such case is during the READ/WRITE operation. During the READ/WRITE operation, the scanner, servo system must be turned off which causes the magnetic motor, both brush and brushless, to drift.

In order to overcome the drifting problem, the electric motor typically must have a built-in brake. Oftentimes, it is not practical to provide such a brake. The brake is costly, therefore making the motor larger and requires more hardware and software to control the brake. This consumes power and adds to the overall complexity of the system 100.

Figure 2:
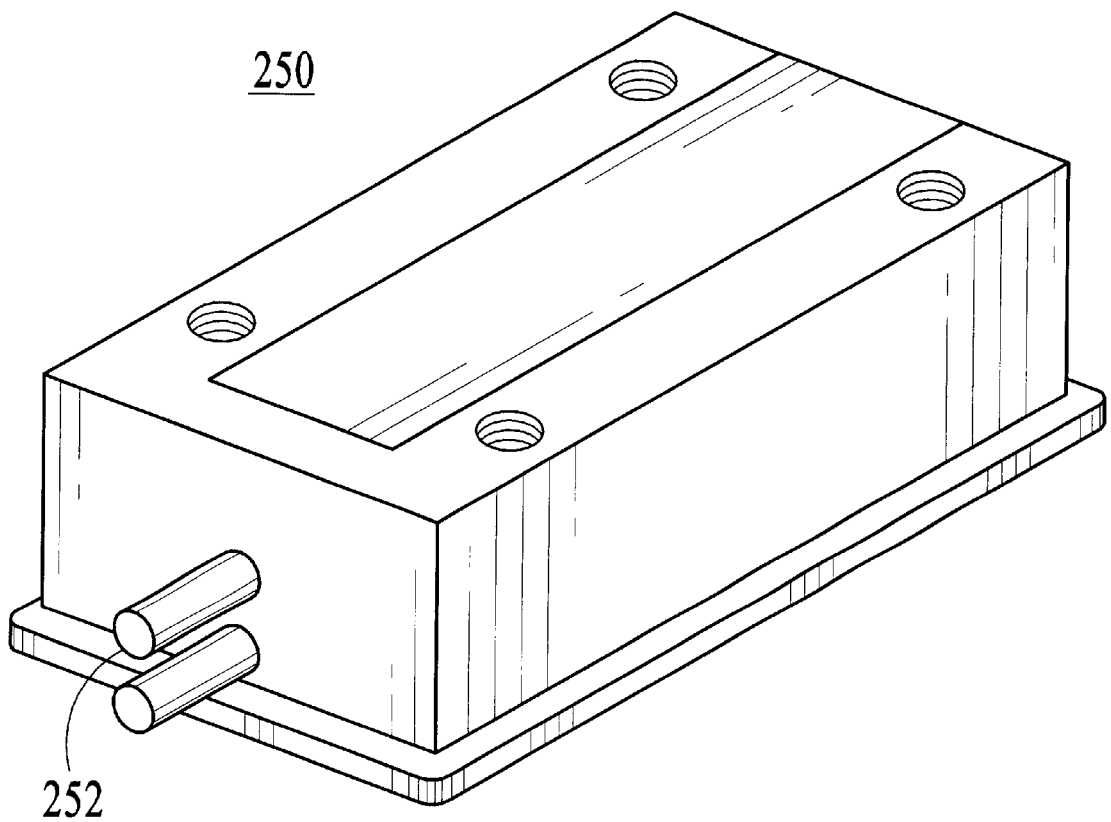
FIG. 2 illustrates a piezoelectric motor.

Accordingly, the present invention utilizes a piezoelectric motor rather than an electric motor in the scanner system to move the fixtures when performing the various processes and tests. FIG. 2 illustrates a piezoelectric motor 250 which would be utilized in a SDT system in accordance with the present invention. An example of such a motor is ultra-precision ceramic motor, Model HR-1, manufactured by Nanomotion, Inc. It has the following characteristics: (1) unlimited travel; (2) high resolution; (3) wide dynamic range of velocity; (4) fast response time; (5) superior "move and settle" times; (6) compact dimensions; (7) direct drive; (8) nanometer position hold stability at power off; (9) wobble-free motion; (10) no intrinsic magnetic field; (11) no external magnetic field sensitivity; (12) no hysterisis; and (13) vacuum versions. The piezoelectric effect in piezoceramics converts electrical field to mechanical strain. Under special electrical excitation drive and ceramic geometry of piezoelectric motors, longitudinal extension and transverse bending oscillation modes are excited at close frequency proximity. The simultaneous excitation of the longitudinal extension mode and the transverse bending mode creates a small elliptical trajectory of the ceramic edge.

By coupling the ceramic edge to a precision stage, a resultant driving force is exerted on the stage, causing stage movement. The periodic nature of the driving force at frequencies much higher than the mechanical resonance of the stage allows continuous smooth motion for unlimited travel, while maintaining high resolution and positioning accuracy typical to piezoelectric devices. Travel can be linear or rotary, depending on the coupling mechanism, typically via tips 252. As is seen, there are two tips 252 shown in this Figure. However, one of ordinary skill in the art recognizes there could be any number.

Closed loop servo control can be provided with standard off the shelf servo controllers, or with a proprietary servo controller that offers full control. Further, the motors can operate in actuation mode. While the driving voltage is not applied, the ceramic plate is stationary and generates holding torque on the stage. Unlike any other braking device, the holding torque of the motor does not cause any position shift.

Figure 3A:
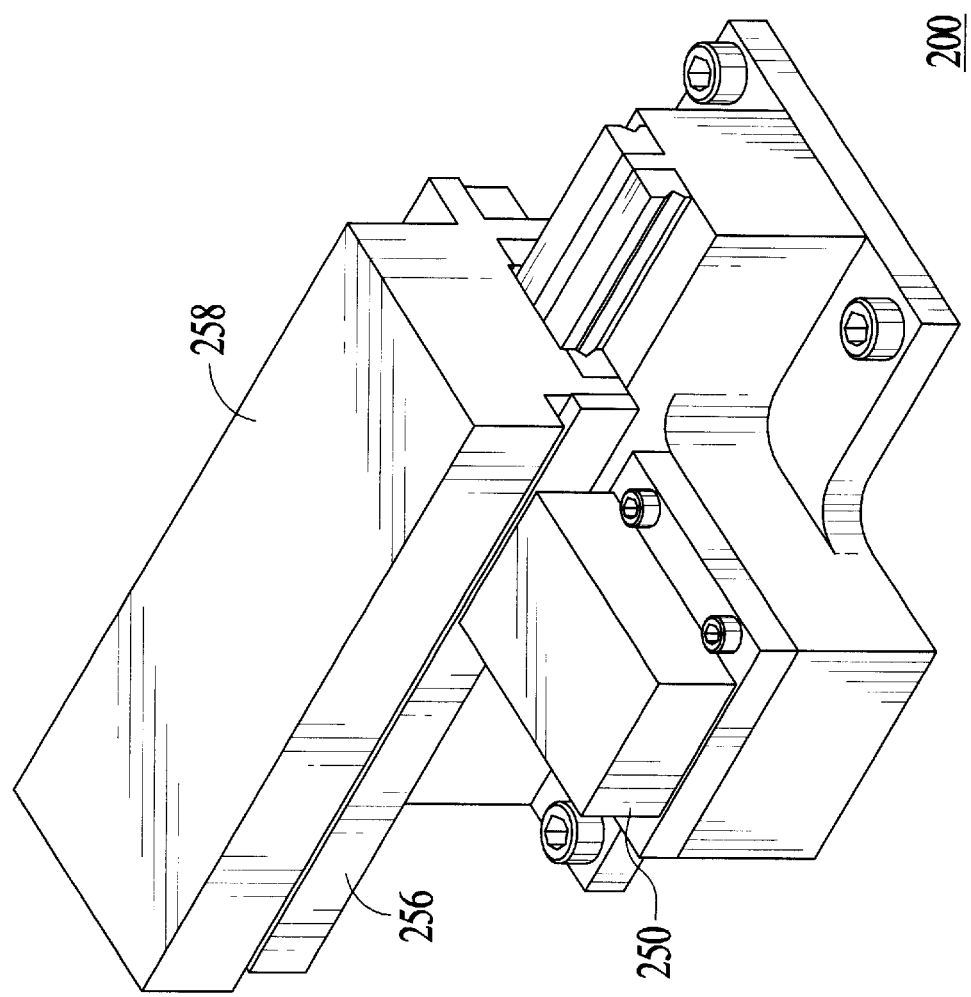
FIG. 3A illustrates a perspective view of a scanner system with a piezoelectric motor attached.
Figure 3B:
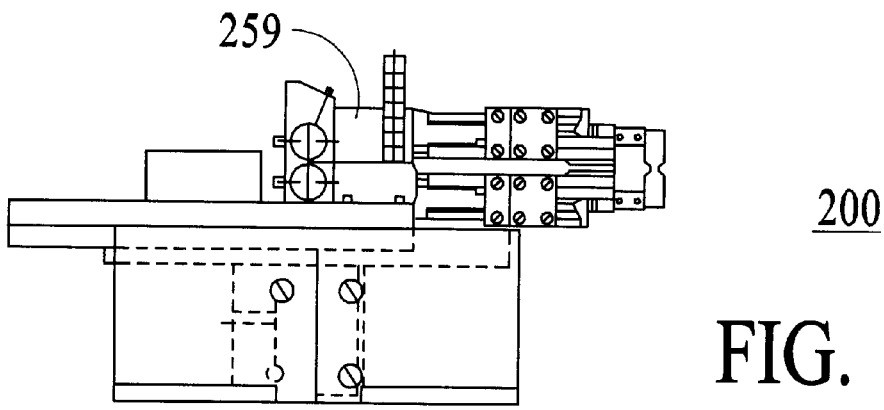
FIG. 3B is a side view of the scanner system including a fixture.
Figure 3C:
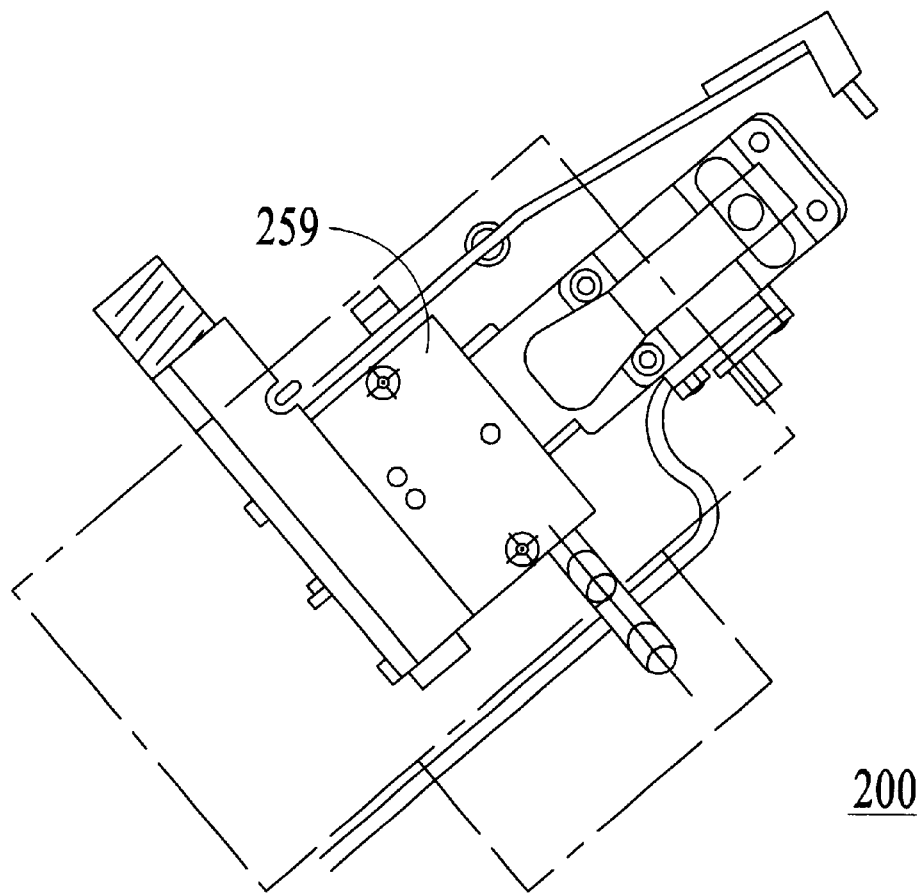
FIG. 3C is a top view of the scanner system including the fixture.
Figure 3D:
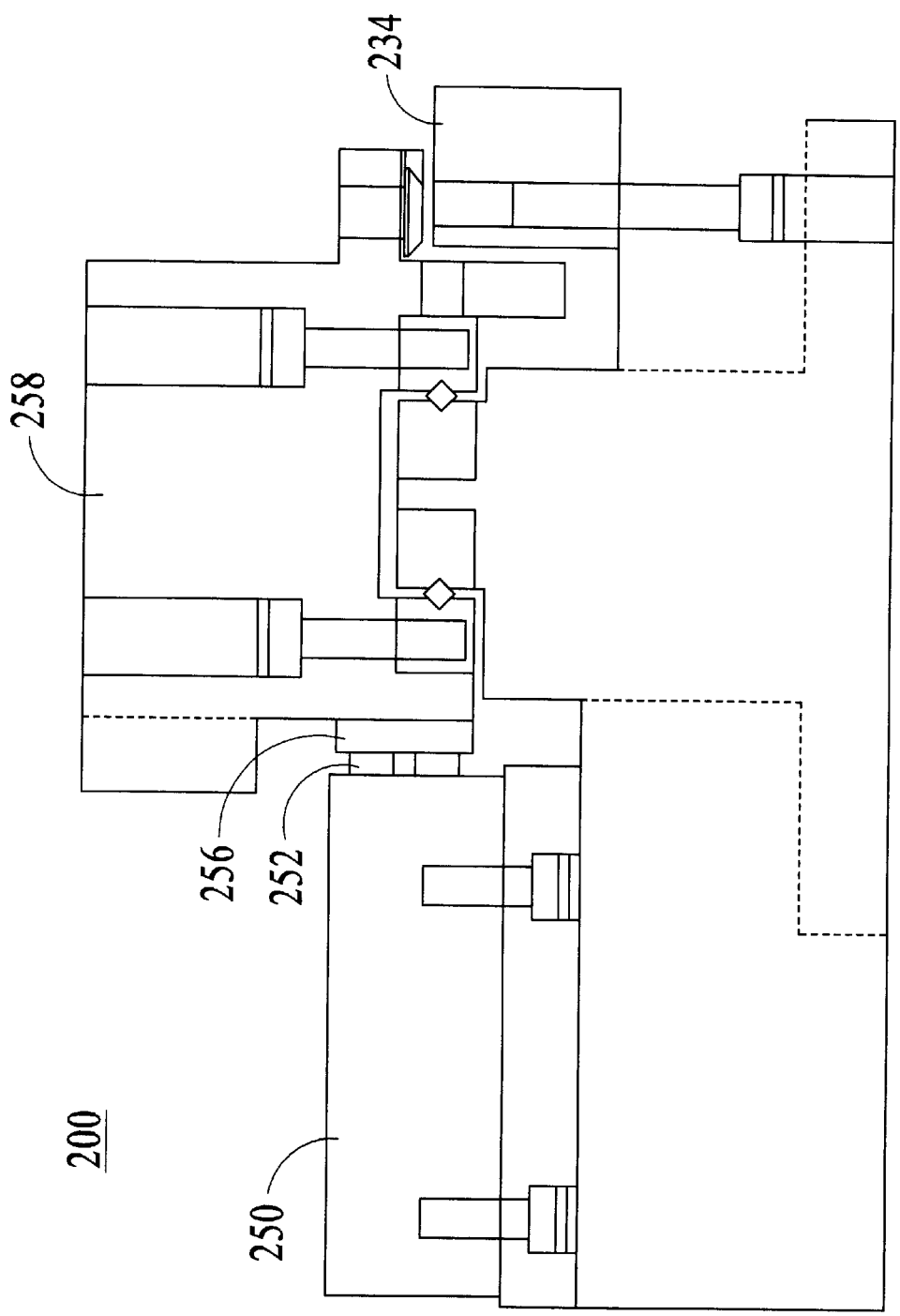
FIG. 3D is a front view of the scanner system.

FIG. 3A illustrates a perspective view of a scanner system 200 with a piezoelectric motor 250 attached. FIG. 3B is a side view of the scanner system 200 including a fixture 259. FIG. 3C is a top view of the scanner system 200 including the fixture 259. FIG. 3D is a front view of the scanner system 200. Referring to FIGS. 3A–3D together, a moveable slide 258 is coupled to a fixture 259 to allow for movement of the head. As before-mentioned, the motor 250 is engaged with the slide through alumina 256 by the tips 252 (FIG. 2). FIG. 3B is a front view of the scanner system 200. In this embodiment, the motor 250 is in a closed loop relationship with encoder 234. The tip 252 of the motor engages the alumina 256 of the slide 258. As the alumina 256 moves, the head of the fixture 259 moves.

As is seen, the tip 252 moves due to the electrical excitation generated by the piezoelectric motor 250, which has no intrinsic magnetic field as compared to the inductive effect generated by a magnetic type of motor. As is further seen, the tip 252 engaging the alumina 256 also acts as brake even if the motor 250 is in an off position. The tip 252 is typically spring loaded. It acts as a brake when a piezo motor is utilized, pushing against the alumina 256. The motor 250, therefore, does not drift when the servo is turned off. Accordingly motor tip 252 and the alumina 256 act as a brake to hold the scanner system position in place without drifting.

Several advantages result when utilizing a method and system in accordance with the present invention. These advantages are described hereinbelow.

1. High Resolution and Position Accuracy

A piezoelectric motor has a driving force at frequencies much higher than the mechanical resonance of the conventional mechanical system which allows for continuous smooth motion for unlimited travel, while maintaining high resolution down to 5 nm and position accuracy. The result is higher performance than that realized in conventional SDT systems.

2. More Compact

Figure 4:
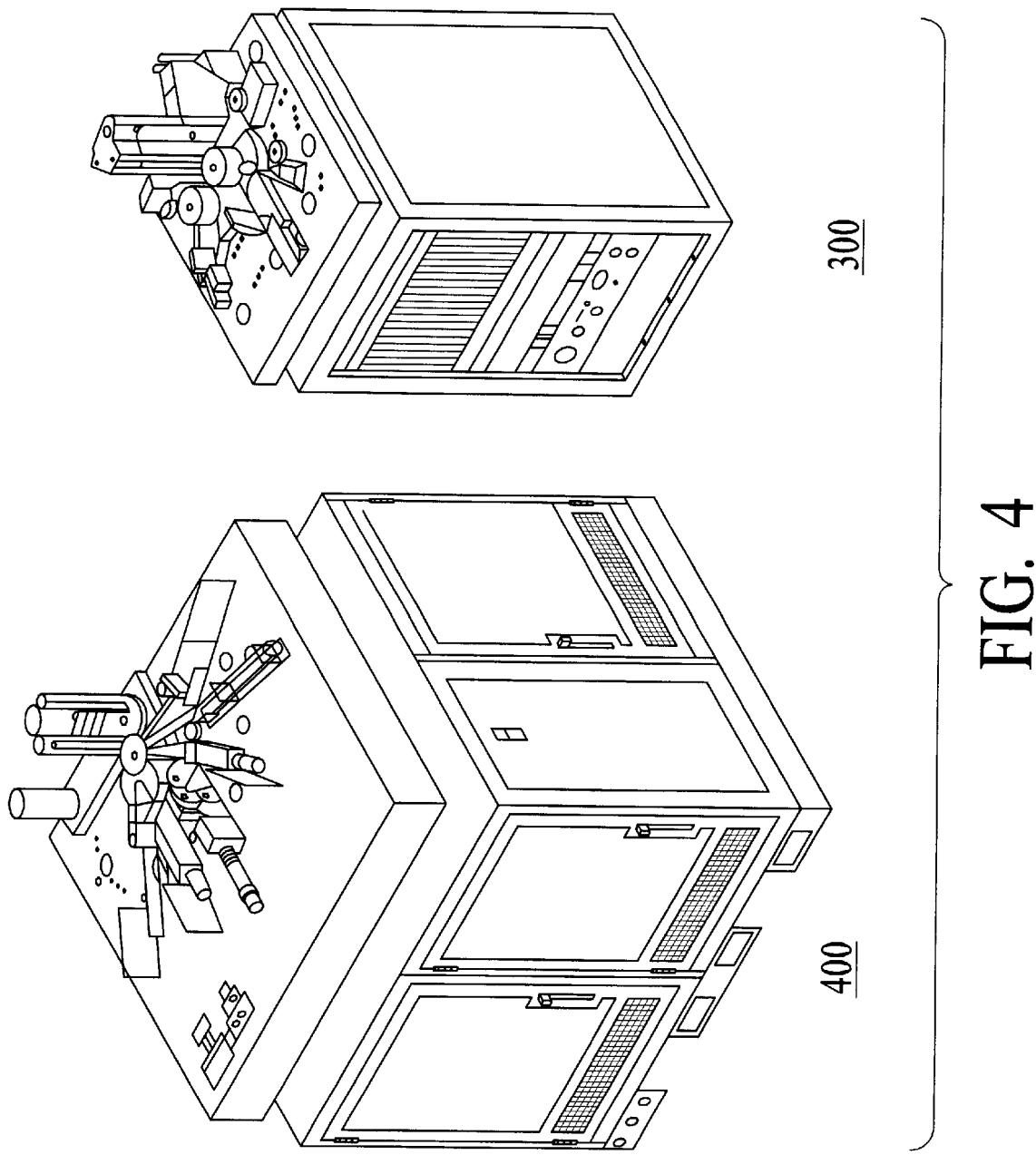
FIG. 4 illustrates the size of a conventional disk test system compared to the size of a disk test system in accordance with the present invention.

Conventional electric motors are large and require significant real estate in the overall system. Due to its nature, the piezoelectric motor is small and compact. With today's technology, the driver is also reduced to very small size. This quality allows the tool's builder to implement a system with small foot print and great flexibility. FIG. 4 illustrates the size of a conventional SDT system 300 compared to the size of a SDT system 400 in accordance with the present invention.

3. Lower Cost

The cost of the piezoelectric motor and driver is also considerably less than the cost of the magnetic motor and driver utilized in conventional systems. A system in accordance with the present invention requires a smaller foot print, thereby reducing the cost of the space (real estate) that it occupies, especially in systems that are in a clean room environment.

4. High System Throughput

The piezoelectric motor is able to achieve high system throughput, due to its (1) fast response time, (2) superior move and settling time, (3) direct drive, (4) wobble free motion and (5) no hysterisis.

5. Reduction of Cycle Time

Figure 5A:
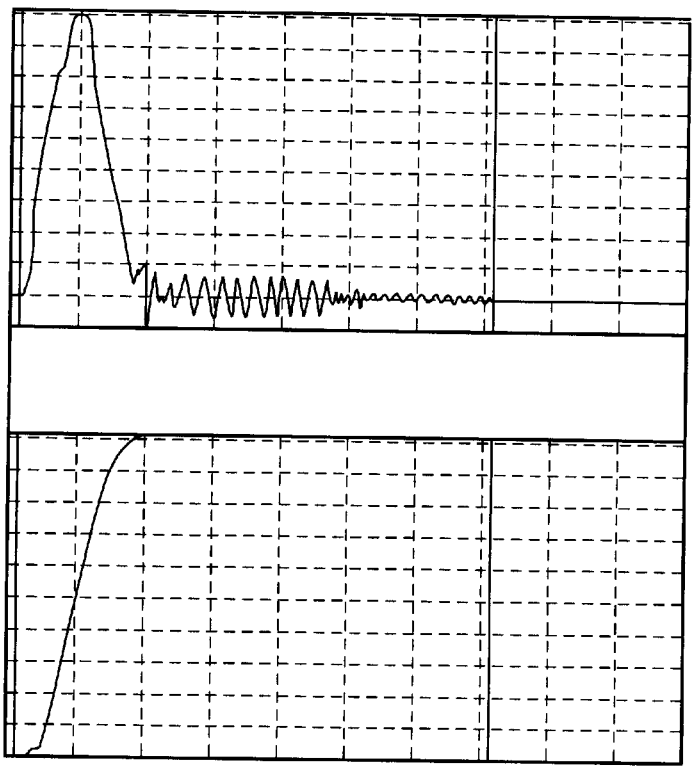
FIGS. 5A and 5B illustrate the step move comparison between a conventional SDT scanner and the SDT system in accordance with the present invention.
Figure 5B:
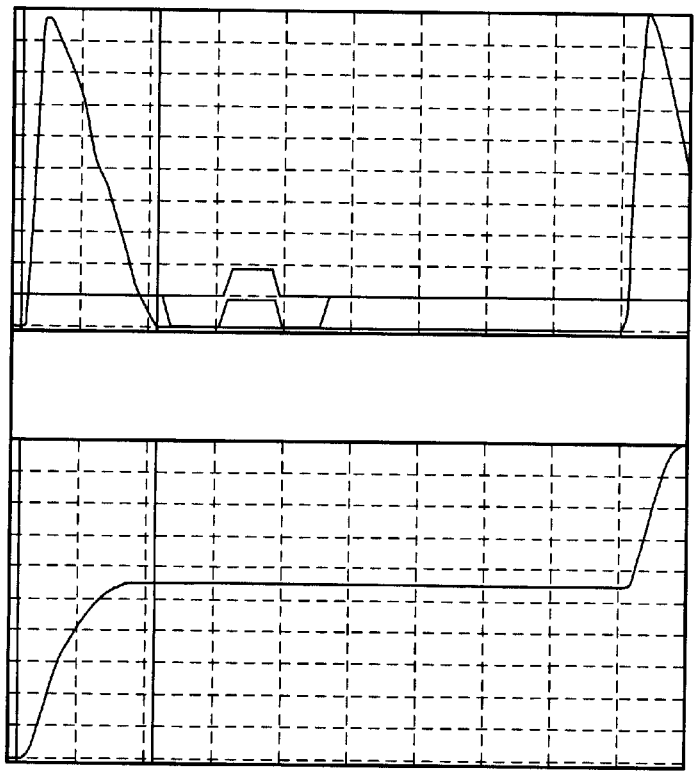

FIGS. 5A and 5B illustrate the step move comparison between a conventional SDT scanner and the SDT system in accordance with the present invention. For example, the conventional SDT system requires 155 msec. to move and settle compared to 45 milliseconds with the SDT system in accordance with the present invention. FIG. 4B shows that the write signal can occur right after the step settles. With the conventional SDT system, a time delay must be added to ensure that the step is completely settled before issuing the write signal. Due to the high performance offered by the SDT system in accordance with the present invention, the time delay can be removed which results in cycle time reduction.

A system and method in accordance with the present invention offers an SDT system which utilizes piezoelectric motors resulting in higher throughput in producing memory disks. The system and method further achieves high performance, is lower cost in implementation, and is more compact than conventional SDT systems. The system and method, by removing time delay, offers the advantage of cycle time reduction over conventional SDT systems.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for use in a memory disk test system comprising:

a moveable slide; and a non-magnetic motor system engageably coupled to the slide for moving the slide in a linear direction, wherein the non-magnetic motor system includes a piezoelectric motor, the piezoelectric motor including at least one tip for engaging an alumina portion of the slide.

2. A system of claim 1 which includes a fixture coupled to the moveable slide for holding a disk head.

3. A single disk test system comprising:

a plurality of scanner systems, each of the scanner systems including a non-magnetic motor system engageably coupled to a slide for moving a test fixture coupled to the slide in a linear direction, wherein the non-magnetic motor system includes a piezoelectric motor, the piezoelectric motor including at least one tip for engaging an alumina portion of the slide.

4. A system for use in a memory disk test system comprising:

a fixture for holding a disk head;

a moveable slide coupled to the fixture; and a non-magnetic motor system engageably coupled to the slide for moving the test fixture in a linear direction, wherein the non-magnetic motor system includes a piezoelectric motor which includes at least one tip for engaging the slide and wherein the at least one tip engages an alumina portion of the slide.

5. A system for use in a memory disk test system comprising:

a moveable slide; and a non-magnetic motor system engageably coupled to the slide for moving the slide in a linear direction, the non-magnetic motor system including at least one tip for engaging an alumina portion of the slide, and for acting as a brake for the slide when the non-magnetic motor system is in an off position.

6. A system of claim 5 which includes a fixture coupled to the moveable slide for holding a disk head.

7. A system of claim 5 wherein the non-magnetic motor system includes a piezoelectric motor.

8. A system of claim 7 wherein the engagement of the at least one tip and the alumina portion acts as the brake when the motor system is in an off position.

9. A single disk test system comprising:

a plurality of scanner systems, each of the scanner systems including a non-magnetic motor system engageably coupled to a slide for moving a test fixture coupled to the slide in a linear direction, the non-magnetic motor system including at least one tip for engaging an alumina portion of the slide, and for acting as a brake for the slide when the non-magnetic motor system is in an off position.

10. A single disk test system of claim 9 wherein the non-magnetic motor system includes a piezoelectric motor.

11. A single disk test system of claim 10, wherein the at least one tip acts as a brake for the slide when the non-magnetic motor system is in an off position.

12. A system for use in a memory disk test system comprising:

a fixture for holding a disk head;

a moveable slide coupled to the fixture; and a non-magnetic motor system engageably coupled to the slide for moving the test fixture in a linear direction, and for acting as a brake for the slide when the non-magnetic motor system is in an off position, wherein the non-magnetic motor system includes a piezoelectric motor which includes at least one tip for engaging the slide and wherein the at least one tip engages an alumina portion of the slide.

* * * * *